(12) United States Patent  
Haruki

(10) Patent No.: US 6,208,165 B1
(45) Date of Patent: Mar. 27, 2001

(54) SEMICONDUCTOR INTEGRATED CIRCUIT

(75) Inventor: Tadashi Haruki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/429,304

(22) Filed: Oct. 28, 1999

(30) Foreign Application Priority Data

Oct. 29, 1998 (JP) ................................... 10-309127

(51) Int. Cl.⁷ ........................ H03K 19/177; H01L 27/10
(52) U.S. Cl. ................................. 326/41; 257/202
(58) Field of Search ........................... 326/41, 47, 101, 326/102; 257/208, 204–206, 211, 202

(56) References Cited

U.S. PATENT DOCUMENTS

| | | | |
|---|---|---|---|
| 4,701,778 | * 10/1987 | Aneha et al. | 257/207 |
| 5,045,725 | * 9/1991 | Sasaki et al. | 326/37 |
| 5,237,184 | * 8/1993 | Yonemaru et al. | 257/202 |
| 5,468,977 | * 11/1995 | Machida | 257/208 |
| 5,532,501 | * 7/1996 | Nakemura | 257/208 |

FOREIGN PATENT DOCUMENTS

| | | |
|---|---|---|
| 03-69163 | 3/1991 | (JP) . |
| 09-191052 | 7/1997 | (JP) . |
| 10-107236 | 4/1998 | (JP) . |

* cited by examiner

*Primary Examiner*—Michael Tokar
*Assistant Examiner*—James H. Cho
(74) *Attorney, Agent, or Firm*—Sughrue, Mion, Zinn, Macpeak & Seas, PLLC

(57) ABSTRACT

In a semiconductor integrated circuit including a plurality of standard cells which are arranged in an array direction to constitute a logic circuit and which are supplied with a clock signal, each of the standard cells has a first side and a second side opposite to each other and extending in the array direction, and a clock signal terminal for receiving the clock signal is provided on only the first side of each of the standard cells. In each of the standard cells, there exists no internal interconnection which is used to supply the clock signal within the standard cell and which reaches the second side of the standard cell.

10 Claims, 3 Drawing Sheets

SEMICONDUCTOR INTEGRATED CIRCUIT

BACKGROUND OF THE INVENTION

1. Field of the Invention

The present invention relates to a semiconductor integrated circuit, and more specifically to a semiconductor integrated circuit laid out in accordance with a standard cell system.

2. Description of Related Art

Recently, when a semiconductor integrated circuit is designed, a so called standard cell system is used as a layout method. In brief, a number of standard cells having various logic functions are previously prepared, and the standard cells are located in accordance with a designed logic circuit, so that a standard cell array is formed. Furthermore, a plurality of standard cell arrays thus formed are located, and then, interconnections for ordinary signals supplied to the standard cell arrays and/or transferred between the standard cell arrays, and interconnections for clock signals supplied to the logic circuits, are laid out.

Now, a method for designing a semiconductor integrated circuit in accordance with a conventional standard cell system will be described with reference to FIG. 5.

As shown in FIG. 5, a plurality of standard cell arrays 9, 10 and 11 are located in accordance with a designed logic circuit. Each of the standard cell arrays 9, 10 and 11 has terminals for a clock signal provided on one side thereof and terminals for an ordinary signal provided on a side thereof opposite to the first mentioned side. For example, the standard cell array 9 includes terminals T1 for a clock signal and terminals T4 for an ordinary signal.

In addition, a clock signal interconnection 12 to be connected to the terminals on the respective side of these standard cell arrays, and an ordinary signal interconnection 13 for transferring the ordinary signals between the standard cell arrays, are located, and connected to necessary terminals provided on the sides of the standard cell arrays.

Now, this will be explained in detail with reference to FIG. 6. FIG. 6 is a diagrammatic plan view of one standard cell 14 included in the standard cell array 9, and connected to the clock signal interconnection 12 and the ordinary signal interconnection 13. The content of the standard cell is various and different from one standard cell to another. The shown example is a standard cell including two transistors receiving a clock signal and an ordinary signal.

As shown in FIG. 6, the clock signal interconnection 12 is connected to the standard cell 14 at the terminal T1 positioned at an upper side of the standard cell in the drawing. On the other hand, the ordinary signal interconnection 13 is connected to the standard cell 14 at the terminal T4 positioned at a lower side of the standard cell in the drawing.

Since there is possibility that each of the clock signal interconnection 12 and the ordinary signal interconnection 13 exists on both opposite sides of the standard cell array, the standard cell has the clock signal terminal T1 and an ordinary signal terminal T2 provided on the upper side of the standard cell and a clock signal terminal T3 and the ordinary signal terminal T4 provided on the lower side of the standard cell. However, all of the terminals T1 to T4 were never used without exception. For example, in the example shown in FIG. 6, the terminals T2 and T3 are not used.

However, when the standard cell as shown in FIG. 6 is used, the following problem has been encountered.

Namely, in the standard cell, a clock is supplied from the clock signal terminal T1 through an internal interconnection 15a to an internal element, for example, a transistor. In this case, the terminal T3 is not used. The clock signal is supplied from the internal interconnection 15a through contacts to an interconnection of another level. However, an interconnection portion 15b between a contact C1 and the terminal T3 is of no use at all.

This useless interconnection 15b exists in each of the standard cells. The useless interconnection becomes a considerable amount for each of the standard cell arrays. This means that the clock signal interconnection 12 meaninglessly includes an excessive parasitic capacitance. Therefore, if the conventional standard cells are used, unnecessary parasitic capacitance is generated, with the result that a speeding-up of a circuit operation is obstructed, and a clock skew occurs.

SUMMARY OF THE INVENTION

Accordingly, it is an object of the present invention to provide a semiconductor integrated circuit which has overcome the above mentioned problem of the prior art.

Another object of the present invention is to provide a semiconductor integrated circuit including standard cells capable of minimizing the parasitic capacitance accompanying the interconnection, so that a high speed operation can be obtained.

The above and other objects of the present invention are achieved in accordance with the present invention by a semiconductor integrated circuit including a plurality of standard cells which are arranged in an array direction to constitute a logic circuit and which are supplied with a clock signal, each of the standard cells having a first side and a second side opposite to each other and extending in the array direction, each of the standard cells having on only the first side a clock signal terminal for receiving the clock signal, each of the standard cells having no internal interconnection which is used to supply the clock signal within the standard cell and which reaches the second side of the standard cell.

In one embodiment, the first side of each of the standard cells includes a first ordinary signal terminal for receiving and/or sending an ordinary signal, in addition to the clock signal terminal for receiving the clock signal, and the second side of each of the standard cell includes a second ordinary signal terminal for receiving and/or sending an ordinary signal.

According to a second aspect of the present invention, there is provided a semiconductor integrated circuit including a plurality of standard cells which are arranged in an array direction to constitute a logic circuit and which are supplied with a clock signal, each of the standard cells having a first side and a second side opposite to each other and extending in the array direction, each of the standard cells having on only the first side a clock signal terminal for receiving the clock signal, the second side of each of the standard cells having no terminal for receiving the clock signal.

According to a third aspect of the present invention, there is provided a semiconductor integrated circuit including a plurality of standard cells which are arranged in an array direction to constitute a logic circuit and which are supplied with a clock signal, each of the standard cells having a first side and a second side opposite to each other and extending in the array direction, each of the standard cells having on only the first side a clock signal terminal connected to a clock signal interconnection for receiving the clock signal, each of the standard cells having no internal interconnection extending between the second side and a contact which connects an internal interconnection connected to the clock signal terminal and for supplying the clock signal within the standard cell, an interconnection of another level.

The above and other objects, features and advantages of the present invention will be apparent from the following description of preferred embodiments of the invention with reference to the accompanying drawings.

DESCRIPTION OF THE PREFERRED EMBODIMENTS

Embodiments of the semiconductor integrated circuit in accordance with the present invention will be described with reference to the drawings.

Figure 1:
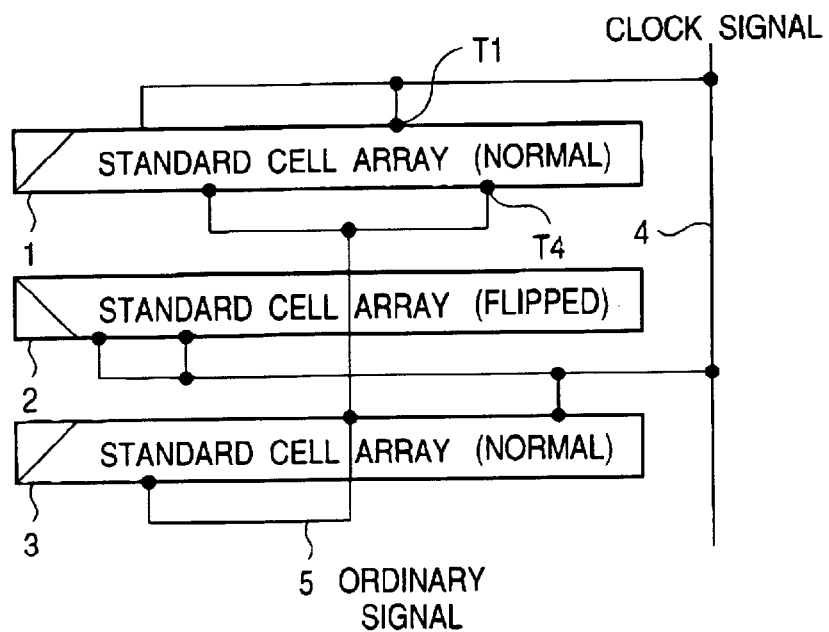
FIG. 1 is a layout diagram illustrating some standard cell arrays and associated interconnections in a first embodiment of the semiconductor integrated circuit in accordance with the present invention.
Figure 5:
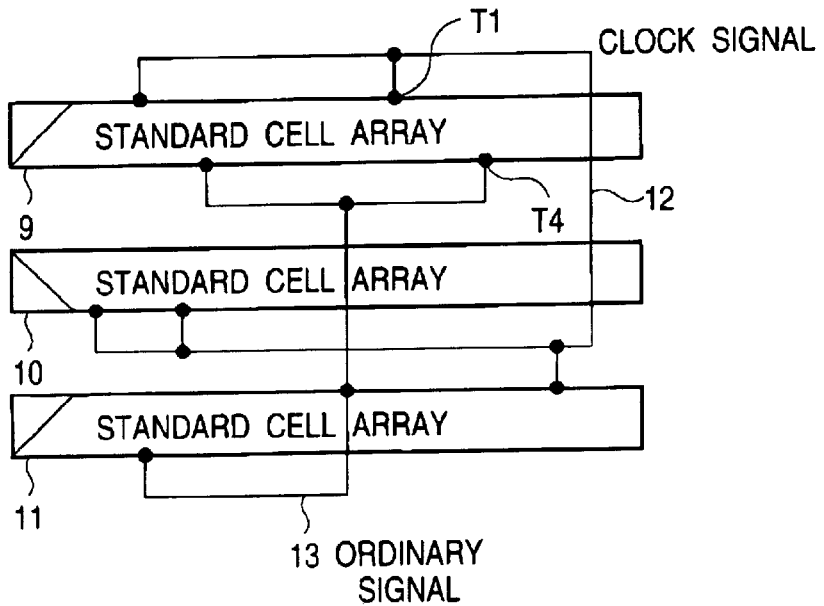
FIG. 5 is a layout diagram illustrating some standard cell arrays and associated interconnections in the prior art semiconductor integrated circuit.

As shown in FIG. 1, a plurality of standard cells are arranged in an array direction in accordance with a designed logic circuit, to form a standard cell array, and a plurality of standard cell arrays 1, 2 and 3 thus formed are located. This first embodiment is different from the prior art example shown in FIG. 5, in the following features:

First, in the first embodiment, the standard cell arrays include normal standard cell arrays I and 3 in which a clock signal terminal T1 is provided on only an upper side of each standard cell, and a flipped standard cell array 2 in which a clock signal terminal T1 is provided on only a lower side of each standard cell. In the prior art standard cell shown in FIG. 6, the clock signal terminals are provided on both the upper side and the lower side. The two kinds of standard cell in this embodiment are different only in the position of the clock signal terminals. Therefore, assuming that the two kinds of standard cell have the same function, namely, are the same in an equivalent circuit, the two kinds of standard cell are different only as to whether or not a layout pattern is simply reversed or flipped. When an internal interconnection pattern within the standard cell will be explained in the following, only a non-reversed pattern will be explained, but explanation of a reversed pattern will be omitted.

In this embodiment, ordinary signal terminals are provided on both the upper side and the lower side of the standard cell. The reason for this is that since it is necessary to transfer ordinary signals between the standard cell arrays, if the ordinary signal terminals are provided on only one side of the standard cell, it becomes difficult to lay out the interconnections for the ordinary signals. On the other hand, although the clock signal terminal is provided on only one side of the standard cell, it is possible to lay out the clock signal interconnections by adopting a tree structure.

In the embodiment shown in FIG. 1, the flipped standard cell array 2 having the clock signal terminal provided on only the lower side of the standard cell is interposed between the normal (namely, not-flipped) standard cell arrays 1 and 3 each having the clock signal terminal provided on only the upper side of the standard cell. If the two kinds of standard cell arrays are located as shown in FIG. 1, a clock signal interconnection 4 can be laid out in the tree structure in a region above the standard cell array 1 and between the standard cell arrays 2 and 3.

Now, referring to FIG. 2, a pattern (internal structure) of the standard cell in this embodiment will be described. In the example shown in FIG. 2, the clock signal terminal T1 exists on only the upper side of the standard cell 6. On the other hand, an ordinary signal terminal T2 exists on the upper side of the standard cell, and the ordinary signal terminal T4 exists on the lower side of the standard cell. In the example shown in FIG. 2, the ordinary signal terminal T4 on the lower side of the standard cell is connected to the ordinary signal interconnection 5, but the ordinary signal terminal T2 on the upper side of the standard cell is connected to no interconnection.

The clock signal interconnection 4 is connected to the clock signal terminal T1 on the upper side of the standard cell, so that the clock signal is supplied through an internal interconnection 7 into an internal circuit of the standard cell. Here, an important point is that, in the drawing, the internal interconnection 7 does not extend to a region lower than a contact C2 which connects the internal interconnection 7 to an interconnection of another level. Comparing FIG. 2 with FIG. 6, this embodiment includes no interconnection corresponding to the extra interconnection 15b which exists in the prior art example. In other words, in this embodiment, there exists no internal interconnection for the clock signal, which extends from the contact towards the lower side of the standard cell. Namely, there exists no clock signal internal interconnection reaching the lower side of the standard cell.

With the above mentioned arrangement, the following remarkable advantages are obtained in this first embodiment. For example, in the case including 2000 standard cells, an overall parasitic capacitance for the clock signal reaches about 20 pF. If the standard cells in accordance with the present invention are used, the parasitic capacitance can be reduced by 6 fF per one standard cell receiving the clock signal. Since the 2000 standard cells include about 300 standard cells each receiving the clock signal, about 1.8 pF can be reduced as a whole. Namely, the parasitic capacitance can be reduced by about 9%. It would be apparent that the reduction of the parasitic capacitance of about 9% will greatly contribute for a high speed operation. Furthermore, it is possible to reduce a region for the interconnections which were required in the prior art but which are no longer required in the present invention. In other words, the area of the standard cell itself can be reduced, so that the chip size can be reduced as a whole.

Figure 3:
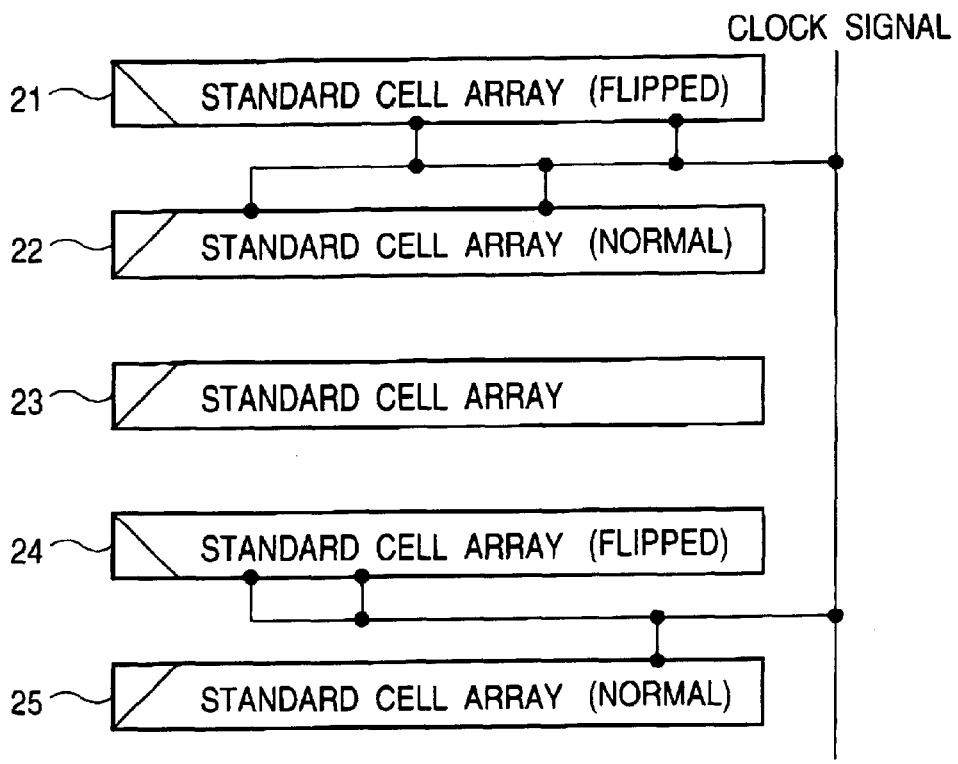
FIG. 3 is a layout diagram illustrating some standard cell arrays and associated interconnections in a second embodiment of the semiconductor integrated circuit in accordance with the present invention.

Now, a second embodiment of the present invention will be described with reference to FIG. 3. This second embodiment is a layout example in which there exists a standard cell array 23 requiring no clock signal. When there exists the standard cell array 23 requiring no clock signal, two standard cell arrays 21 and 22 or 24 and 25 positioned above or below the standard cell 23 are constituted of a combination of a normal standard cell array 22 or 25 and a flipped standard cell array 21 or 24 in such a manner that a clock signal terminal side of the standard cell array 22 or 24 adjacent to the standard cell array 23 requiring no clock signal does not face to the standard cell array 23, as shown in FIG. 3. With this arrangement, it is no longer necessary to locate the clock signal interconnection between the standard cell arrays 22 and 23 and between the standard cell arrays 23 and 24. Therefore, it is possible to locate a different kind of interconnection in a region having no clock signal interconnection, between the standard cell arrays. Alternatively, if no clock signal interconnection exists between the standard cell arrays, it is possible to reduce a spacing between the standard cell arrays, so that the chip area can be correspondingly reduced.

Figure 4:
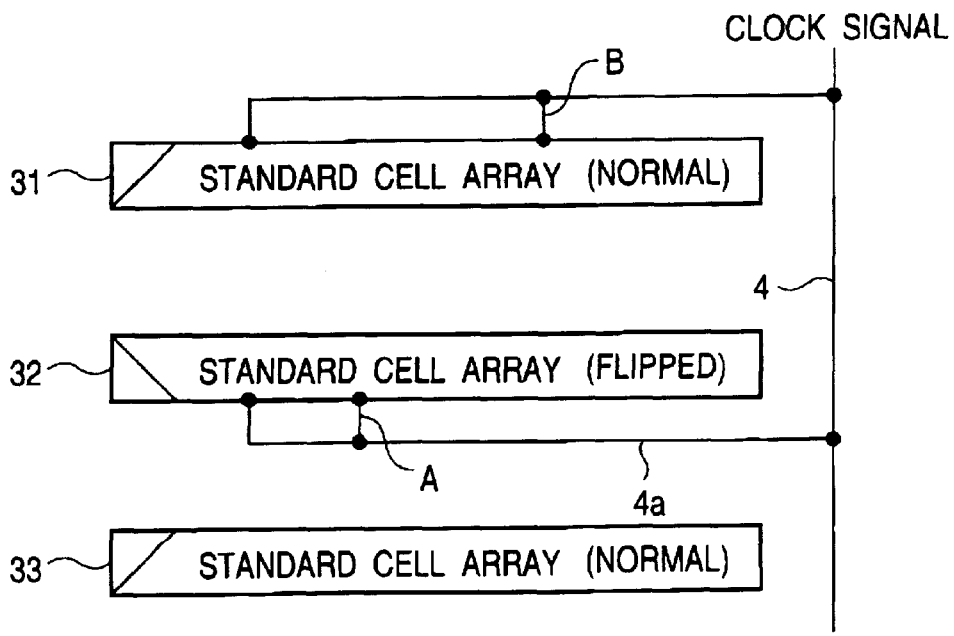
FIG. 4 is a layout diagram illustrating some standard cell arrays and associated interconnections in a third embodiment of the semiconductor integrated circuit in accordance with the present invention.

Next, a third embodiment of the present invention will be described with reference to FIG. 4. This third embodiment is a layout example in which there exists a standard cell array 33 requiring no clock signal, but a standard cell array 32 requiring the clock signal is located adjacent to the standard cell array 33 in such a manner that a clock signal terminal side of the standard cell array 32 is positioned to face to the standard cell array 33. In this embodiment, since it is not necessary to supply the clock signal to the standard cell array 33, an interconnection portion 4a along the standard cell array 32, of the clock signal interconnection, can be located to make a distance A between the standard cell array 32 and the interconnection portion 4a, shorter than a distance B between another clock signal interconnection portion which extends between two standard cell arrays (31 and another not shown) both requiring the clock signals, and each of the two standard cell arrays. With this arrangement, the parasitic capacitance of the clock signal interconnection can be reduced.

Figure 2:
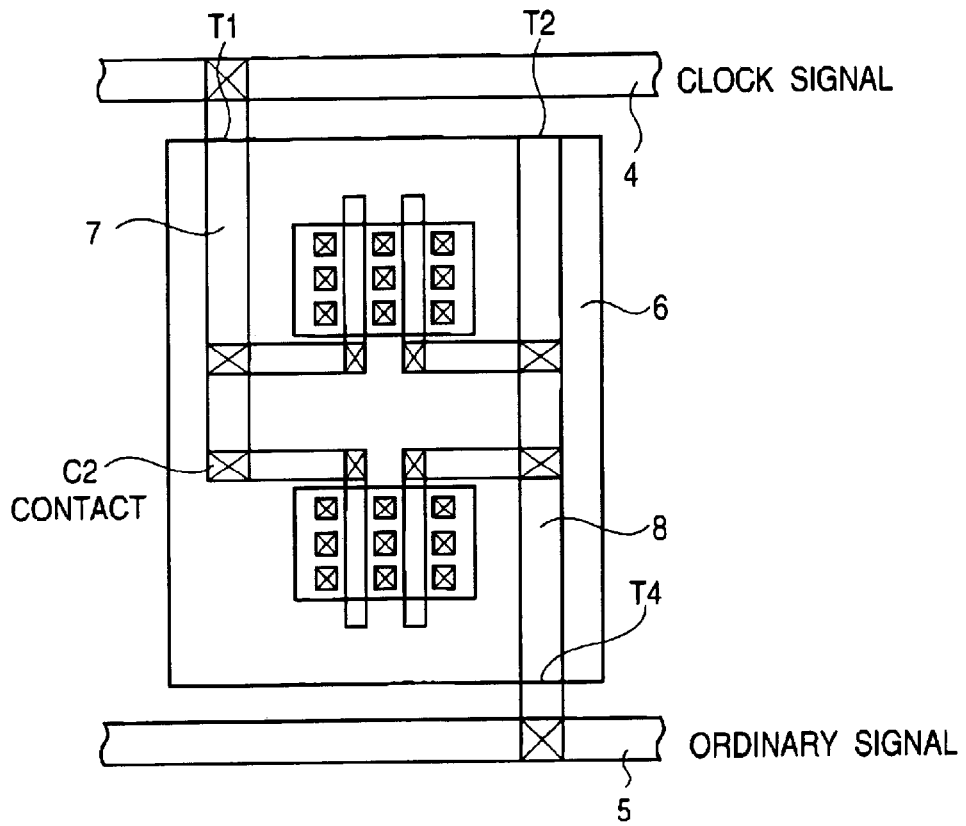
FIG. 2 is a plan view illustrating an example of standard cells included in the standard cell array shown in FIG. 1.
Figure 6:
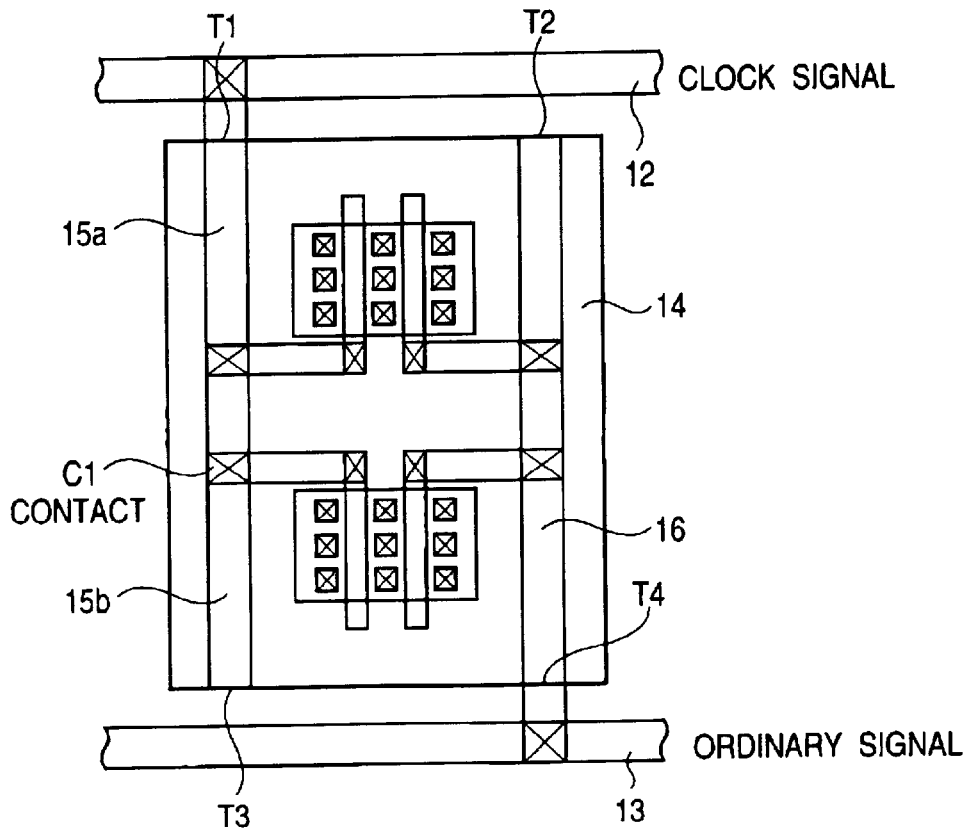
FIG. 6 is a plan view illustrating an example of standard cells included in the standard cell array shown in FIG. 5.

In the second and third embodiments, clock signal terminals are located on only one side of the standard cell array by using the standard cells shown in FIG. 2. The advantage of the second and third embodiments cannot be obtained if the standard cell shown in FIG. 6 is used.

As seen from the above, according to the present invention, since it is possible to minimize a wasteful parasitic capacitance within the standard cell, it is possible to realize a high speed operation.

The invention has thus been shown and described with reference to the specific embodiments. However, it should be noted that the present invention is in no way limited to the details of the illustrated structures but changes and modifications may be made within the scope of the appended claims.

What is claimed is:

1. A semiconductor integrated circuit including a plurality of standard cells which are arranged in an array direction to constitute a logic circuit and which are supplied with a clock signal, each of said standard cells having a first side and a second side opposite to each other and extending in said array direction, each of said standard cells having on only said first side a clock signal terminal for receiving said clock signal, each of said standard cells having no internal interconnection which is used to supply the clock signal within the standard cell and which reaches said second side of the standard cell.

2. A semiconductor integrated circuit claimed in claim 1 wherein said first side of each of said standard cells includes a first ordinary signal terminal for receiving and/or sending an ordinary signal, in addition to said clock signal terminal for receiving said clock signal, and said second side of each of said standard cell includes a second ordinary signal terminal for receiving and/or sending an ordinary signal.

3. A semiconductor integrated circuit claimed in claim 2 wherein between first and second standard cell arrays each composed of said standard cells, there is located a third standard cell array requiring no clock signal, said second side of said standard cells included in each of said first and second standard cell arrays being positioned to face to said third standard cell array.

4. A semiconductor integrated circuit claimed in claim 1 wherein between first and second standard cell arrays each composed of said standard cells, there is located a third standard cell array requiring no clock signal, said second side of said standard cells included in each of said first and second standard cell arrays being positioned to face to said third standard cell array.

5. A semiconductor integrated circuit claimed in claim 2 wherein adjacent to a first standard cell array composed of said standard cells, there is located a second standard cell array requiring no clock signal, said first side of said standard cells included in said first standard cell array being positioned to face to said second standard cell array, and a distance between a clock signal interconnection located along said first side of said standard cells included in said first standard cell array and said first standard cell array, being shorter than a distance between a clock signal interconnection located along a third standard cell array and said third standard cell array.

6. A semiconductor integrated circuit claimed in claim 1 wherein adjacent to a first standard cell array composed of said standard cells, there is located a second standard cell array requiring no clock signal, said first side of said standard cells included in said first standard cell array being positioned to face to said second standard cell array, and a distance between a clock signal interconnection located along said first side of said standard cells included in said first standard cell array and said first standard cell array, being shorter than a distance between a clock signal interconnection located along a third standard cell array and said third standard cell array.

7. A semiconductor integrated circuit including a plurality of standard cells which are arranged in an array direction to constitute a logic circuit and which are supplied with a clock signal, each of said standard cells having a first side and a second side opposite to each other and extending in said array direction, each of said standard cells having on only said first side a clock signal terminal for receiving the clock signal, said second side of each of said standard cells having no terminal for receiving said clock signal.

8. A semiconductor integrated circuit claimed in claim 7 wherein between first and second standard cell arrays each composed of said standard cells, there is located a third standard cell array requiring no clock signal, said second side of said standard cells included in each of said first and second standard cell arrays being positioned to face to said third standard cell array.

9. A semiconductor integrated circuit claimed in claim 7 wherein adjacent to a first standard cell array composed of said standard cells, there is located a second standard cell array requiring no clock signal, said first side of said standard cells included in said first standard cell array being positioned to face to said second standard cell array, and a distance between a clock signal interconnection located along said first side of said standard cells included in said first standard cell array and said first standard cell array, being shorter than a distance between a clock signal interconnection located along a third standard cell array and said third standard cell array.

10. A semiconductor integrated circuit including a plurality of standard cells which are arranged in an array direction to constitute a logic circuit and which are supplied with a clock signal, each of said standard cells having a first side and a second side opposite to each other and extending in said array direction, each of said standard cells having on only said first side a clock signal terminal connected to a clock signal interconnection for receiving the clock signal, each of said standard cells having no internal interconnection extending between said second side and a contact which connects an internal interconnection connected to said clock signal terminal and for supplying said clock signal within the standard cell, an interconnection of another level.

* * * * *